United States Patent [19]

Levinstein et al.

[11] Patent Number: 4,985,373

[45] Date of Patent: Jan. 15, 1991

[54] MULTIPLE INSULATING LAYER FOR TWO-LEVEL INTERCONNECTED METALLIZATION IN SEMICONDUCTOR INTEGRATED CIRCUIT STRUCTURES

[75] Inventors: Hyman J. Levinstein, Union; William D. Powell, Jr., Plainfield, both of N.J.; Ashok K. Sinha, Allentown, Pa.

[73] Assignee: AT&T Bell Laboratories, Murray Hill, N.J.

[21] Appl. No.: 357,647

[22] Filed: May 24, 1989

Related U.S. Application Data

[63] Continuation of Ser. No. 907,654, Sep. 15, 1986, abandoned, which is a continuation-in-part of Ser. No. 605,077, Apr. 30, 1984, abandoned, which is a continuation-in-part of Ser. No. 371,055, Apr. 23, 1982, abandoned.

[51] Int. Cl.$^5$ .................................... H01L 21/443
[52] U.S. Cl. .................................... 437/195; 437/228; 437/982; 148/133; 148/135
[58] Field of Search .............. 437/195, 228, 982; 148/DIG. 135, DIG. 133; 357/23.1, 23.3, 23.6, 23.7, 23.9, 54.73

[56] References Cited

U.S. PATENT DOCUMENTS

| | | | |
|---|---|---|---|
| 3,882,530 | 5/1975 | Danchenko | 357/54 |
| 3,925,572 | 12/1975 | Naber | 427/87 |
| 4,005,455 | 1/1977 | Watrous, Jr. et al. | 357/71 |
| 4,134,125 | 1/1979 | Adams et al. | 357/54 |
| 4,151,546 | 4/1979 | Kawagai et al. | 357/71 |
| 4,204,894 | 5/1980 | Komeda et al. | 357/30 |
| 4,291,328 | 9/1981 | Lien et al. | 357/54 |
| 4,319,260 | 3/1982 | Tasch, Jr. et al. | 357/59 |
| 4,324,038 | 4/1982 | Chang et al. | 357/65 |
| 4,360,823 | 11/1982 | van Gils | 357/52 |
| 4,365,264 | 12/1982 | Mukai et al. | 357/52 |
| 4,446,194 | 5/1984 | Candelaria et al. | 357/54 |
| 4,514,233 | 4/1985 | Kawabuchi | 357/91 |
| 4,630,088 | 12/1986 | Ogura et al. | 357/23.6 |

FOREIGN PATENT DOCUMENTS

| | | | |
|---|---|---|---|
| 0061980 | 5/1977 | Japan | 437/195 |
| 0126966 | 10/1981 | Japan | 437/195 |
| 57-7153 | 1/1982 | Japan | 357/52 |
| 57-7154 | 1/1982 | Japan | 357/52 |
| 57-27047 | 2/1982 | Japan | 357/52 |
| 59-35452 | 2/1984 | Japan | 357/23.3 |
| 0232636 | 10/1986 | Japan | 437/195 |

OTHER PUBLICATIONS

S. M. Sze, #*Semiconductor Devices Physics and Technology*, John Wiley & Sons, New York (1985) pp. 360–361.
W. Fichtner et al, "Experimental results on submicron-channel size p–MOSFETs" *IEEE Electron Device Letters*, vol. EDL-3 (Feb., 1982) pp. 34–37.
A. Saiki et al, "Three level metallization with PIQ insulation", *The Transactions of the IECE of Japan*, vol. E63 (Jun., 1980) pp. 484–485.
J. A. Bialko et al, "Reducing interlevel shorts in sputtered insulators" *IBM Technical Disclosure Bulletin*, vol. 20 (Jun., 1977) pp. 149–150.
J. R. Gardiner et al, "Passivated refractory gate field-effect transistor", *IBM Technical Disclosure Bulletin*, vol. 16 (Sep., 1973) p. 10645.
H. R. Gates, "Encapsulation for semiconductor devices", *IBM Technical Disclosure Bulletin*, vol. 8 (Apr., 1966) p. 1687.

*Primary Examiner*—Olik Chaudhuri
*Assistant Examiner*—Ourmazd S. Ojan
*Attorney, Agent, or Firm*—D. I. Caplan

[57] ABSTRACT

Insulation between first and second levels of aluminum metallization in semiconductor integrated circuit structures comprises a plasma planarized, deposited silicon dioxide layer and another silicon dioxide layer deposited upon said plasma planarized layer.

11 Claims, 1 Drawing Sheet

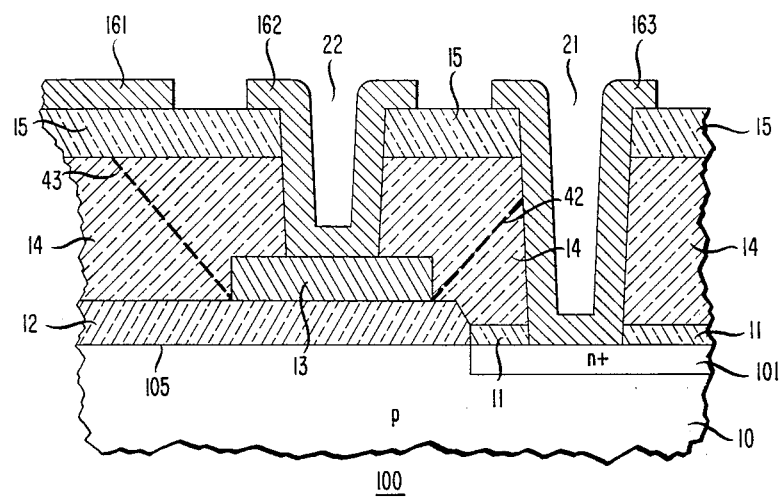

MULTIPLE INSULATING LAYER FOR TWO-LEVEL INTERCONNECTED METALLIZATION IN SEMICONDUCTOR INTEGRATED CIRCUIT STRUCTURES

CROSS-REFERENCE TO RELATED APPLICATION

This application is a continuation of our copending application Ser. No. 907,654, filed Sept. 15, 1986 which was abandoned a continuation-in-part of our copending application Ser. No. 605,077, filed Apr. 30, 1984 now abandoned, which was a continuation-in-part of our still earlier application Ser. No. 371,055, filed Apr. 23, 1982, abandoned.

FIELD OF THE INVENTION

This invention relates to semiconductor apparatus, and more particularly to semiconductor integrated circuit structures.

BACKGROUND OF THE INVENTION

Semiconductor MOS (metal oxide semiconductor) integrated circuit structures, especially those having a minimum features size of about 2 micron or less (2 micron or less design rules), typically contain two different levels of aluminum metallization. Each such level of metallization includes an array of electrically conducting strips of metal for interconnecting various electronic device elements, such as transistors, integrated in a single crystal silicon semiconductor body. By "different levels" of metallization it is meant that the corresponding metal strips of the "different levels" are located upon different insulating layers which isolate the metallization strips from one another and from the semiconductor body, and hence different levels of metallizations are usually located at differing distances from the underlying semiconductor body. Typically the first level metallization is insulated from the underlying semiconductor body by a field oxide layer located in contact with the silicon body. The metallization strips on different levels, however, ordinarily run at right angles to each other, whereby cross-overs occur at the resulting cross-points or intersections of second level strips with respect to first level strips. It is important that this first and second level metallization be separated by a good insulating layer to prevent spurious electrical connections or "shorts" between first and second level strips, particularly in the neighborhoods of cross-overs.

A typical insulating layer for this purpose is formed by a chemical vapor deposited (CVD) layer of silicon dioxide, deposited after the first level metallization—but before the second level metallization—has been formed. Workers in the art, however, have suspected that undesirable fissures (cracks) are generated through such a silicon dioxide layer, stemming at corner edges of the first level metallization strips. Such cracks give rise to a problem of undesirable short-circuits of second and first level metallizations at cross-overs caused by migration of metal from the second level metallization strips through the cracks down to the first level strips. This problem of short-circuits becomes especially serious in dense arrays (2 micron spacing or less design parameters) of integrated circuit device elements. Since the metal that is sometimes used for the first level metallization, such as aluminum, melts at temperatures below those which would be required to seal the fissures by a high temperature oxide flowing or densification step, such a high temperature step to seal the fissure is not then practical. Moreover, even if the metal is of the kind that does not melt during this high temperature flowing or densification step, undesirable lateral and vertical diffusion of impurities occurs in the silicon body, whereby loss of control over the lateral extents and vertical depths of the corresponding impurity zones will result. Furthermore, when using a phosphorus-rich silicon dioxide ("P-glass") layer as the insulating layer—i.e., a glass layer containing more than about 6 percent phosphorus by weight—flowing or densification of such an insulating layer can result in the formation of shrinkage voids in the phosphorus-rich oxide from the fissures therein, such voids undesirably distorting any apertures that are subsequently formed which touch these voids.

It would therefore be desirable to have a structure which mitigates the problems caused by fissures in the insulating layers.

SUMMARY OF THE INVENTION

Insulation between first and second level metallization in a semiconductor integrated circuit structure comprises a plasma planarized first insulating layer located upon the first level metallization and a second insulating layer located upon the first insulating layer. Advantageously, the first insulating layer is either a phosphorus-rich or a phosphorus-poor (less than about 6 percent phosphorus by weight) silicon dioxide glass layer, and the second layer is a phosphorus-poor silicon dioxide layer. In this way, the undesired propagation of cracks is contained within the first insulating layer; and, at the same time, such problems as interfacial trapped charges otherwise arising from mechanical stress, which would be caused by the use of the insulating layers of differing thermal expansion coefficient, are avoided, particularly since the two insulating layers of this invention have substantially identical chemical compositions—i.e., compositions that are identical except perhaps for impurities in amounts that do not cause the expansion coefficients of the two layers to be significantly different. Advantageously, the second insulating layer has a uniform thickness, whereby its top surface is planar and thus is suitable for supporting the second level metallization. Also, since phosphorus-poor oxide is less moisture absorbent than is phosphorus-rich oxide, the use of phosphorus-poor oxide has the advantage of being less reactive with metallization like aluminum and hence the advantage of promoting a more stable structure.

In a specific embodiment, the first and second level metallization are aluminum strips for circuit interconnections, while both the first insulating layer, a phosphorus-rich glass, and the second insulating layer, a phosphorus-poor glass, are chemical vapor deposited (CVD) silicon dioxide ("oxide") layers, the top surface of the phosphorus-rich layer being substantially everywhere planar by virtue of having been plasma planarized (smoothed by plasma etching). Moreover, the second level metallization can penetrate through apertures in both silicon dioxide layers to make contact with an underlying silicon semiconductor body in which the circuit is integrated. Advantageously, these apertures are formed by anisotropic etching so as not to enlarge any cracks in the phosphorus-rich oxide layer; and a relatively thin layer of titanium nitride, for example, can optionally coat the sidewalls of the apertures in order to ensure further that aluminum of the second level metallization is not shorted through cracks in the phosphorus-rich oxide to the first level metallization.

As a result of the planarization of the phosphorus-rich oxide layer in accordance with the invention, the cracks or fissures that form in the phosphorus-rich oxide layer do not propagate through the phosphorus-poor oxide layer, so that shorts between first and second level metallization are prevented. Moreover, advantageously the phosphorus-poor oxide layer has a substantially uniform thickness, whereby the top surface of this phosphorus-poor oxide layer is also substantially everywhere planar. Thus, a desirably substantially everywhere planar surface is presented by the top surface of the phosphorus-poor oxide layer for the deposition thereon of second level metal. Accordingly, even if the second level metal, such as aluminum, does not deposit conformally (with uniform thickness) upon a rough surface, nevertheless, because of the planarity of the top surface of the phosphorus-poor oxide layer, the second level metal substantially everywhere forms with a uniform thickness and hence affords more reliable second level interconnections. Moreover, during operation a relatively thin region of aluminum metallization would undesirably become still thinner owing to electromigration of aluminum toward the relatively thick regions of the aluminum metallization during current flow therethrough. On the other hand, in the neighborhood of each contact of second level aluminum with the semiconductor body, a relatively thick pad of aluminum carrying no current serves to suppress such migration from the relatively thin regions of the aluminum contact. Furthermore, the relatively low temperatures of plasma planarization processing required in this invention avoids the undesirable diffusion of impurities in the silicon body which occurs at the relatively high temperatures of processing required in the case of a flowing or densification of the phosphorus-rich oxide layer. Also, the undesirable voids which form from fissures in the phosphorus-rich oxide layer after flowing or densification do not occur during the planarization of this invention.

Finally, apertures for connecting the second level metallization with the first level metallization and for connecting the second level with the semiconductor body can be simultaneously formed, as by anisotropic reactive sputter (ion) etching the first and second oxide layers, a process which does not undesirably widen any cracks encountered in the first oxide layer (as would occur with isotropic etching).

BRIEF DESCRIPTION OF THE DRAWING

This invention can be better understood from the following detailed description when read in conjunction with the drawing in which the FIGURE shows a cross-sectional view of a semiconductor integrated circuit structure in accordance with a specific embodiment of the invention.

Only for the sake of clarity, the drawing is not to any scale.

DETAILED DESCRIPTION

As shown in the FIGURE, a semiconductor integrated circuit structure portion 100 comprises an essentially p-type single crystal silicon semiconductor body portion 10 having an n+-type surface zone 101 at a horizontal major surface 105 of the body. A relatively thin, typically 250 Å, thermally grown silicon dioxide layer 11 ("gate oxide") coats the major surface 105 overlying the n+ zone 101 (except for the region of an aperture 21 in this gate oxide layer); and a relatively thick, typically about 4,000 Å, thermally grown layer of silicon dioxide 12 ("field oxide") coats the remaining portion of the surface 105, that is, the portion complementary to that coated by the gate oxide. A first level metallization strip 13 of aluminum, typically about 7,000 Å thick and about 2 microns wide as formed by selective masking and etching of a physically deposited (evaporation or sputtering) aluminum layer, overlies a portion of the field oxide layer 12. Alternatively, the first level metal can be other metals, such as tungsten, or can be a metal silicide, such as tantalum silicide, cobalt silicide, or titanium silicide. A plasma planarized CVD deposited layer of phosphorus-rich silicon dioxide 14, typically about 10,000 Å thick, overlies exposed surfaces of the gate oxide 11, the field oxide 12, and the first level metallization strip 13. By "phosphorus-rich" silicon dioxide is meant, as stated above, an oxide layer containing at least about 6 percent by weight of phosphorus. Typically, however, the phosphorus content is kept below about 8 percent.

A pair of fissures 42 and 43 propagate from corner edge surfaces of the first level strip 13 as shown. More specifically, the fissures 42 and 43 run along a direction of typically about 45 degrees with respect to the horizontal to a sidewall of the aperture 21 (at the level of the oxide layer 14) and thence to the top surface of the phosphorus-rich oxide layer 14.

The phosphorus-rich oxide layer 14 has an aperture 22 (down to the top surface of the first level strip 13) in addition to the aperture 21, in order to enable interconnection of the first level strip 13 with a second level metallization strip 162. As known in the art, the first and second level metallization strips serve to interconnect various transistors (and perhaps other electronic device elements) that are integrated (not shown) in the body at the major surface 105 thereof, as well as typically to supply external electrical access to some of these transistors.

Upon the phosphorus-rich oxide layer 14 is located a phosphorus-poor oxide layer 15 is thus also substantially everywhere typically about 5,000 Å. Advantageously, the top surface of this phosphorus-poor oxide layer 15 is thus also substantially everywhere planar, the phosphorus-rich oxide layer 14 having been planarized. By "phosphorus-poor" is meant a phosphorus content by weight in the approximate range of 0 to as much as 5 or 6 percent, typically 0 to 4 percent. Finally, the structure 100 includes second level metallization strips 161, 162, and 163, typically of aluminum having a thickness of about 12,000 Å. These second level strips (as was the first level strip 13) are typically formed by a physical deposition process as evaporation or sputtering and patterned by selective masking and dry reactive sputter etching. The aperture 21 extends through both oxide layers 15 and 14 as well as through the gate oxide layer 11 down to the n+ zone 101.

A useful sequence of steps to fabricate the structure 100 includes first forming the thick field oxide layer 12 over a limited portion of the surface 105, thermally growing the thin gate oxide layer 11, and then forming the zone 101 by introduction of impurities, as by ion implantation using the thick field oxide as a protective mask against introduction of the impurities.

Then the first level metallization strip 13 is formed by a physical deposition process followed by masking and etching. (This first level strip is formed at a time before the aperture 21 in the gate oxide 11 exists.) It is preferred that the top surface of this first level metallization does not comprise polycrystalline silicon or any other material that is susceptible of being etched by the same process used for etching either the gate oxide 11, the phosphorus-rich oxide layer 14, or the phosphorus-poor oxide layer 15—lest the first level metallization be undesirably etched during the etching of apertures 21 and 22.

Then a phosphorus-rich oxide layer is deposited by a CVD step involving typically the chemical reaction of $SiH_4$ and $PH_3$ with oxygen at a pressure of about 1.0 torr and temperature of about 440° C., and subsequently this deposited oxide layer is plasma planarized to form the phosphorus-rich oxide layer 14 with a planar top surface. Fissures 42 and 43 develop in the layer 14 during deposition, because of the sharp corner edges of the first level metallization at its interface with the field oxide 12. These fissures remain after plasma planarization. The planarization of this oxide layer 14 can be achieved by first depositing a phosphorus-rich oxide layer with a thickness well in excess of the ultimately desired value, and then depositing a thick, smooth-topped sacrificial layer (typically of polymer or spun-on resist) thereon characterized by an etch rate substantially equal to that of the phosphorus-rich oxide and of sufficient thickness to have a top surface which is substantially planar, and then plasma etching with a mixture of $CF_4$ and about 8 percent by volume of oxygen, for example, at about 50° to 60° in order to remove entirely the sacrificaial layer—all as described more fully by A. C. Adams in "Plasma Planarization," *Solid State Technology*, Vol. 24, pp. 178-181 (Apr. 1981). Alternatively, $CHF_3$ mixed with as much as about 40 percent to 50 percent (by volume) oxygen can be used instead of $CF_4$ and oxygen.

Next the phosphorus-poor oxide layer 15 is deposited, typically by a low pressure (at or below about 1.0 mm Hg) CVD step involving the chemical reaction of $SiH_4$ with oxygen at a temperature of about 440° C. Then the apertures 21 and 22 are opened, through the oxide layers 15, 14, and 11 for the aperture 21 and through the oxide layers 15 and 14 for the aperture 22. For opening these apertures, an anisotropic etching process should be used, in order not to enlarge the fissure 42. That is, a combined physical and chemical process—such as reactive sputter (ion) etching with $CHF_3$—should be used. Steep sidewalls of the apertures 42 and 43 thus result.

A thin layer of sealant, such as titanium nitride, optionally may then be applied to seal the fissure 42. This sealant is believed not to be essential in many applications because of the formation, during the etching of the aperture 21, of an insulating polymer—for example, of silicon-carbide-fluoride-oxide—which seals the fissure 42. Moreover, in many integrated circuits there are statistically significantly fewer opportunities for fissures to be present (of the kind formed by the fissure 42) running to the sidewalls of apertures than for fissures (like fissure 43) to be present running to the interface of the oxide layers 14 and 15, and hence there is a smaller failure probability occasioned by the fissure 42 than by the fissure 43.

Finally, a second level metallization of aluminum is formed in a pattern of second level metallization strips 161, 162, 163 on the top of the structure 100, as by conventional techniques of physical deposition followed by selective masking and etching. This second level aluminum metallization can be an aluminum-silicon alloy or a bilayer of polysilicon overlaid with aluminum, as known in the art. It should be understood that the structure 100 as thus fabricated should further contain a passivation layer (not shown), such as plasma CVD silicon nitride, located on top of the structure 100.

Notice how, for example, the strip 161 is isolated from the fissure 43, and hence insulated from the first level strip 13, by the phosphorus-poor oxide layer 15. This oxide layer 15, it should be noted, is deposited with uniform thickness over a planarized surface of the phosphorus-rich oxide layer 14, and therefore presents a desirably smooth (planar) surface for deposition thereon of the second level metallization.

Instead of the phosphorus-rich oxide layer 14, a phosphorus-poor oxide layer can be used, containing phosphorus 0 to 5 or 6 precent by weight, typically deposited by deposition from a plasma containing argon and oxygen into which liquid or vapor TEOS (tetra-orthosilicate) is injected, at a substrate temperature of 250° to 450° C. Alternatively, this layer can also be deposited by the CVD step described above for the layer 15 so long as the somewhat higher required deposition temperatures (above 350° C.) for CVD can be tolerated. Likewise, the layer 15 itself can be plasma deposited. The use of phosphorus-poor oxide for the first insulating layer (as well as for the second insulating layer) would appear to have the added advantage of being less reactive with the aluminum metallization.

Although the invention has been described in terms of a specific embodiment, various modifications can be made without departing from the scope of the invention. For example, instead of using $CHF_3$ for etching the aperture, other anisotropic reactive ion etchants of silicon dioxide can be used, such as a mixture of $CHF_3$ and $NH_3$, or of $CHF_3$ and $O_2$, or of $CHF_3$ and $CO_2$. Instead of titanium nitride for sealing the fissure 42, other sealants can be used, such as molybdenum. Also, when using a refractory material for the first level metal, such as tungsten or metal silicide, instead of titanium nitride a polycrystalline silicon layer can be inserted underneath the second level aluminum metallization. It should be obvious that the metal strip 162 can penetrate through an aperture (not shown) in the field oxide layer 12 to make contact with the major surface 105. Also, both the deposited dielectric layers 14 and 15 could be of the same composition (i.e., both layer phosphorus-rich or phosphorus-poor), in which case the advantage of crack termination would still be preserved, but the problem either of moisture corrosion or of ion migration (respectively) would remain. Finally, instead of silicon dioxide as the phosphorus-poor insulating layer, other insulating layers can be used, such as plasma CVD silicon nitride or silicon oxynitride.

What is claimed is:

1. A method of making an integrated circuit structure based on a silicon body including the system of:
   (a) forming a first electrically conductive region overlying a top surface of the body;
   (b) forming a first insulating region of essentially silicon dioxide, containing a first concentration of phosphorus, overlying the first conductive region;
   (c) treating an upper surface of the first insulating region to form a substantially planar upper surface thereof;
   (d) depositing a second insulating region of essentially silicon dioxide and of substantially uniform thickness upon the substantially planar upper surface of the first insulating region, whereby at least a portion of an upper surface of the second insulating region is substantially planar, the first insulating region containing a concentration of phosphorus which is higher than that of the second insulating region; and (e) forming a second electrically conductive region upon a portion of the upper surface of the second insulating region.

2. The method of claim 1 in which the second insulating region has a uniform thickness, whereby substantially the entire upper surface of the second insulating region is substantially planar.

3. The method of claim 1 in which the first insulating region contains about 6 percent phosphorous by weight.

4. The method of claim 1 in which the second insulating layer contains 0 to about 6 percent phosphorous by weight.

5. The method of claim 1 in which both the first and the second electrically conductive layers contain aluminum.

6. The method of claim 1 in which an aperture extends through both the first and the second insulating regions, and in which the second electrically conductive region extends through the aperture to a top surface of the first electrically conductive region.

7. A method of making a semiconductor integrated circuit containing a plurality of transistors integrated in the body at a major surface thereof comprising the steps of:

(a) forming a field oxide insulating layer overlying the major surface at areas thereof located between the transistors;

(b) forming a first level metallization strip comprising aluminum overlying a first portion of the field oxide insulating layer;

(c) forming a first insulating layer comprising silicon dioxide overlying both the first level metallization strip and at least a portion of the field insulating layer;

(d) substantially planarizing a top surface of the first insulating layer;

(e) forming a second insulating layer of substantially uniform thickness, comprising silicon dioxide, upon the first insulating layer, whereby the top surface of the second insulating layer is also substantially planar, the first insulating layer containing a concentration of phosphorus which is higher than that of the second insulating layer; and (f) forming a second level metallization strip, comprising aluminum, overlying the second insulating layer.

8. The method of claim 7 wherein the body comprises silicon and the field insulating layer comprises silicon dioxide.

9. The method of claim 8 further comprising the step of forming an aperture through the second and first insulating layers prior to step (f) and thereafter during step (f) forming an additional second level strip overlying the second insulating layer and contacting the first level metallization strip through the aperture.

10. The method of claim 9 in which each of the transistors comprises a gate oxide insulating layer thinner than the field oxide insulating layer, and further comprising the steps of forming a common aperture extending through the second insulating layer, the first insulating layer and the gate oxide layer; and thereafter forming during step (f) yet another second level metallization strip overlying a portion of the second insulating layer and extending down through the common aperture into contact with a portion of the major surface at the bottom of the common aperture.

11. The method of claim 8 in which each of the transistors has a gate oxide layer, the method further comprising the steps of etching a common aperture extending through the second and first and gate insulating layers; and thereafter forming during step (f) another second level metallization strip overlying a portion of the second insulating layer and extending down through the common aperture into contact with a portion of the major surface at the bottom of the common aperture.

* * * * *